US006033783A

United States Patent [19]

Tanaka et al.

[11] Patent Number: 6,033,783

[45] **Date of Patent: *Mar. 7, 2000**

[54] ULTRAFINE AL PARTICLE AND PRODUCTION METHOD THEREOF

[75] Inventors: Shun-ichiro Tanaka; BingShe Xu, both of Yokohama, Japan

[73] Assignees: Research Development Corporation of Japan; Kabushiki Kaisha Toshiba, both of Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/861,821

[22] Filed: May 23, 1997

[30] Foreign Application Priority Data

May 27, 1996 [JP] Japan .................................... 8-131681

[51] Int. Cl.[7] ........................................................ B32B 5/16

[52] U.S. Cl. ............................ 428/408; 75/255; 148/437; 420/528; 502/355

[58] Field of Search ..................... 75/249, 255; 148/415, 148/437; 420/528; 502/355; 428/408

[56] References Cited

U.S. PATENT DOCUMENTS 5,407,458 4/1995 Konig et al. .............................. 75/255

FOREIGN PATENT DOCUMENTS

0735001A2 10/1996 European Pat. Off. .

0735001A3 7/1997 European Pat. Off. .

OTHER PUBLICATIONS

P. Herley et al., "Ultra–Fine Particles of Aluminium Formed by Electron–Beam–Induced Decomposition of Aluminium Hydride," *Materials Letters*, vol. 7, No. 12, Mar. 1989.

B. Xu et al., "Phase Transformation and Bonding of Ceramic Nanoparticles in a Tem," *NanoStructured Materials*, vol. 6, pp. 727–730, 1995.

*Primary Examiner*—George Wyszomierski
*Attorney, Agent, or Firm*—Finnegan, Henderson, Farabow, Garrett & Dunner, L.L.P.

[57] ABSTRACT

An ultrafine Al particle consists of an Al multiply twinned particle. The Al multiply twinned particle has a decahedron structure surrounded by {111} planes. The Al multiply twinned decahedral particle has a diameter of 10 to 30 nm. Such an ultrafine Al particle consisting of the Al multiply twinned decahedral particle is obtained as follows. A metastable Al oxide particle is placed on an amorphous carbon substrate having the reduction effect. Then the electron beam is irradiated to the metastable Al oxide particle placed on the amorphous carbon substrate in the vacuum atmosphere. From the metastable Al oxide particle, Al atoms or Al clusters are emitted and adsorbed to the substrate. By adjusting the electron beam intensity so that the ultrafine Al particle in the above procedure has a diameter from 10 to 30 nm, the Al multiply twinned particle having a decahedron is obtained.

6 Claims, 4 Drawing Sheets

4a

T

{111}

{111}

ULTRAFINE AL PARTICLE AND PRODUCTION METHOD THEREOF

BACKGROUND OF THE INVENTION

1. Field of the Invention

This invention relates to an ultrafine Al particle consisting of a multiply twinned particle and a production method thereof.

2. Description of the Related Art

With a diameter of 100 nm or less (ultrafine particles), metal particles have different properties from normal particles (with a diameter of 1 $\mu$m or more, for example). New properties may be observed because the number of atoms existing on a particle surface increases relative to total number of atoms of the particle, and an effect of surface free energy cannot be ignored in consideration of the properties of particles.

Ultrafine particles as described above have different properties from bulk materials. They have a lower melting point and a lower sintering temperature than bulk materials, for example. Further, when there are a plurality of ultrafine particles, the tunnel effect or quantum mechanical effects (such as quantum well and mini-band) may be generated among them. Depending on the type of the particles, a high catalyst property may be generated. The ultrafine particles are suitable for finding new surface phenomena and grasping outlines thereof. These properties can be applied to various areas including material properties improvement, development of various devices and application to functional materials including catalysts. Thus, the physical properties and applications of ultrafine particles are studied.

Conventionally, ultrafine particles are produced by physical or chemical methods as described below: Physical production methods of ultrafine particles include an evaporation method in gases, a metal evaporation synthesis method, a vacuum evaporation method on a fluid oil. According to the evaporation method in gases, a metal or the like is evaporated in inert gas, so that ultrafine particles are produced to be cooled and condensed by collision with the gas. As a material for ultrafine particles, metal atoms evaporated by sputtering is also utilized. According to the metal evaporation synthesis method, a metal is heated in a vacuum and the vaporized metal atoms are deposited, together with an organic solvent, on a substrate cooled under a freezing point of the organic solvent. According to the vacuum evaporation method on a fluid oil, a metal is deposited on an oil for production of ultrafine articles.

As chemical methods to produce ultrafine particles, those utilizing a liquid or vapor phase are known. The methods utilizing the liquid phase include a colloid method, an alkoxide method and a coprecipitation method. In the colloid method, a noble metal salt is reduced in alcohol coexisted with a high molecular surface active agent under reflux. In the alkoxide method, it is utilized hydrolysis of a metal alkoxide. In the coprecipitation method, a precipitant is added to a metal salt mixture to obtain precipitated particles.

Ultrafine particle production methods utilizing the vapor phase include an organic metal compound pyrolysis method, a metal chloride reducting/oxidizing/nitriding method, a reduction method in hydrogen, and a solvent evaporation method. In the organic metal compound pyrolysis method, a metal carbonyl compound is pyrolyzed to obtain metal ultrafine particles. In the metal chloride reducting/oxidizing/nitriding method, a metal chloride is reduced/oxidized or nitrided in an air current of reacting gases. In the reduction method in hydrogen, an oxide or a hydrate is heated in a hydrogen current for reduction. In the solvent evaporation method, a metal salt solution is atomized through a nozzle to dry in hot air.

Conventional studies and developments of the ultrafine particles are mainly with regard to an aggregate of various ultrafine particles. Properties and applications of an ultrafine particle as an unit substance are less studied. This fact is also resulted from the above-mentioned production methods of the ultrafine particles. By the conventional production methods, it is difficult to obtain an ultrafine particle as an unit substance.

For example, application of ultrafine Al particles to various functional materials such as catalysts and devices is studied. For such application development, it is preferable to improve the controllability of the crystal direction and crystal plane for controlling the properties of ultrafine Al particle. By conventional production methods, however, it is difficult just to obtain an ultrafine particle as an unit substance. Further, even if the particle as an unit substance are obtained, it is quite difficult to control their crystal direction and crystal plane. This problem obstructs application development of the ultrafine Al particle.

SUMMARY OF THE INVENTION

It is an object of the present invention to provide an ultrafine Al particle which can be obtained as an unit substance and whose crystal direction and other properties can be easily controlled. Another object of the present invention is to provide an ultrafine Al particle which enables various operations, controls and application developments. Still another object of the present invention is to provide a production method of an ultrafine Al particle which enables production of an ultrafine Al particle as described above with a good reproducibility.

The ultrafine Al particle of the present invention consists of a multiply twinned particle (MTP) of Al. Such an Al multiply twinned particle has a decahedron structure surrounded by {111} planes and having a diameter of 10 to 30 nm.

The ultrafine Al particle production method of the present invention is a procedure to generate an Al multiply twinned particle having a decahedron structure surrounded by {111} planes. The method comprises a step of placing a metastable Al oxide particle on a substrate having the reduction effect, irradiating an electron beam to the metastable Al oxide particle placed on the substrate in the vacuum atmosphere, and emitting Al atoms or Al clusters from the metastable Al oxide particle and adsorbing such Al atoms or Al clusters on the substrate to produce the ultrafine Al particle. By adjusting the intensity of the electron beam so that the ultrafine Al particle has a diameter of 10 to 30 nm, the Al multiply twinned particle having the decahedron is generated.

When the electron beam is irradiated in the vacuum atmosphere to the metastable Al oxide particle placed on a substrate having the reduction effect (such as an amorphous carbon substrate), ultrafine particles of Al, which is a constituent of the metastable Al oxide particle, are generated. By controlling the irradiation conditions of the electron beam in this process, an Al multiply twinned particle having a decahedron surrounded by {111} planes are obtained substantially corresponding to the generation distance of the ultrafine Al particle (distance from the metastable Al oxide particle).

An ultrafine Al particle consisting of an Al multiply twinned decahedral particle has a large distortion at the edges of the decahedron. Each of the twin planes with such large distortion is chemically quite active. The distortion results in the magnetic field orientation property of the ultrafine Al particle of the present invention so that the vertex direction of the decahedron becomes parallel with the direction of the applied magnetic field. It also has an advantage to improve the activity when applying the ultrafine Al particle to a catalyst or the like, for example.

DESCRIPTION OF THE PREFERRED EMBODIMENTS

Referring to the attached figures, preferred embodiments of the present invention will be described below.

Figure 1A:
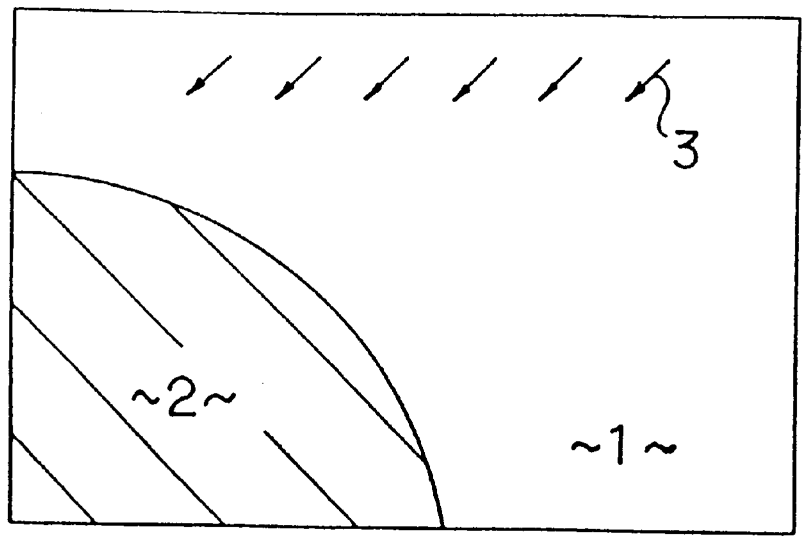
FIGS. 1A and 1B are model views illustrating an embodiment of the production process of ultrafine Al particles according to the present invention.
Figure 1B:
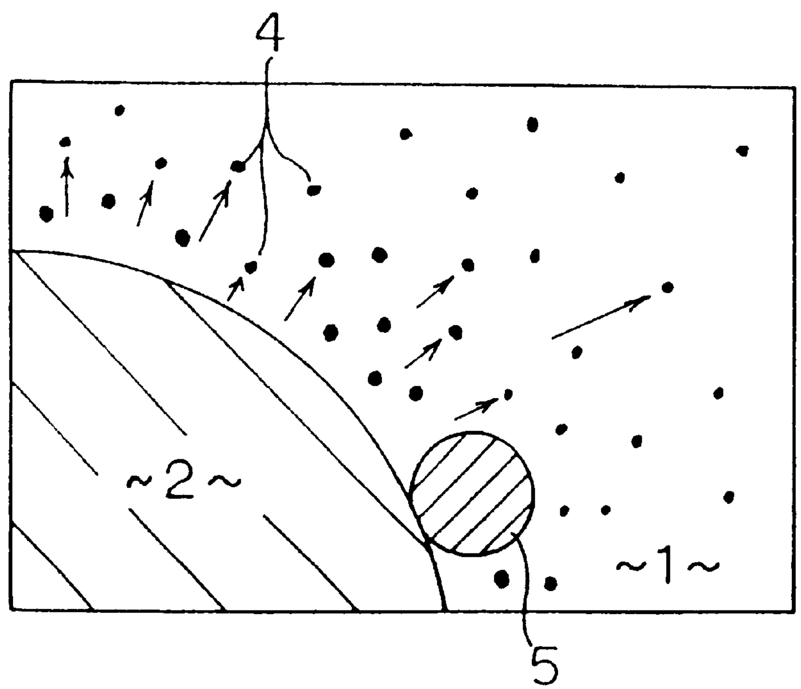

FIGS. 1A and 1B illustrate an embodiment of the ultrafine Al particle production process according to the present invention as a model. In the figure, reference numeral 1 indicates an amorphous carbon substrate having the reduction effect. As the amorphous carbon, i-carbon is used, for example. As shown in FIG. 1A, a metastable Al oxide particle 2 is placed on the amorphous carbon substrate 1.

An example of the metastable Al oxide particle 2 is $\theta$-$Al_2O_3$, which is $Al_2O_3$ in the metastable phase. The diameter of the metastable Al oxide particle 2 is not particularly limited, but a particle having a diameter of 50 to 300 nm is preferably used. To the metastable Al oxide particle 2 comprising $\theta$-$Al_2O_3$ of the metastable phase placed on the amorphous carbon substrate 1, electron beam 3 is irradiated.

The intensity of the electron beam 3 irradiated to the metastable Al oxide particle 2 is preferably in the range from $1.0\times10^{19}$ to $1.0\times10^{21}$ e/cm$^2$·sec. The irradiation of the electron beam 3 is executed in the vacuum atmosphere. Specifically, it is preferable to irradiate the electron beam 3 in the vacuum atmosphere of $1\times10^{-5}$ Pa or less. When irradiating the electron beam 3, it is not necessary to particularly heat the amorphous carbon substrate 1. The irradiation of the electron beam 3 is executed at the room temperature.

Figure 2:
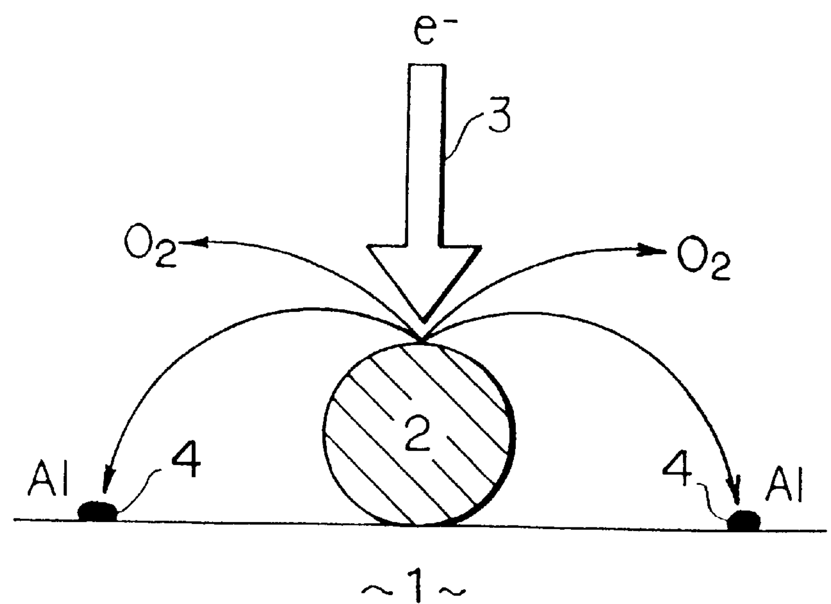
FIG. 2 is a model view illustrating the forming status of ultrafine Al particles from metastable Al oxide particles.

As shown in FIG. 2, when the electron beam 3 is irradiated to the metastable Al oxide particle 2, the metastable Al oxide particle 2 is activated, which results in emission of Al and O as the elements constituting the particle. The oxygen emitted from the metastable Al oxide particle 2 is reduced and Al as the metal element comprised in the metastable Al oxide particle 2 alone adheres onto the amorphous carbon substrate 1 around it, for example as cluster. This is because the electron beam is irradiated in the vacuum atmosphere and the metastable Al oxide particle 2 is placed on the amorphous carbon substrate 1 having the reduction effect.

When the electron beam 3 is irradiated in the vacuum atmosphere to the metastable Al oxide particle 2 placed on the amorphous carbon substrate 1 having the reduction effect, ultrafine Al particles 4 are generated around the metastable Al oxide particle 2 as shown in FIG. 1B. In this process, some of the generated particles are $\alpha$-$Al_2O_3$ particles 5, which is $Al_2O_3$ in the stable phase. Irradiation of the electron beam 3 to the metastable Al oxide particle 2 involves transformation from $\theta$-$Al_2O_3$ in the metastable phase to $\alpha$-$Al_2O_3$ in the stable phase.

The transformation from $\theta$-$Al_2O_3$ in the metastable phase to $\alpha$-$Al_2O_3$ in the stable phase is usually caused in a high temperature area of about 1400 K only. In this invention, the electron beam 3 is irradiated in the vacuum atmosphere and the metastable Al oxide particle 2 is placed on the amorphous carbon substrate 1 having the reduction effect. These conditions result in a carbon atmosphere around the metastable Al oxide particle 2 when the electron beam 3 is irradiated. Thus, the partial pressure of oxygen around the metastable Al oxide particle 2 becomes much lower than the actual degree of vacuum. This means that the effective degree of vacuum is largely improved.

Therefore, this invention enables transformation from $\theta$-$Al_2O_3$ to $\alpha$-$Al_2O_3$, activation of $\theta$-$Al_2O_3$ particles involving such phase transformation and generation of ultrafine Al particles by activation of $\theta$-$Al_2O_3$ at the room temperature. It is quite significant to enable generation of ultrafine Al particles by irradiation of the electron beam on room temperature stage.

Figure 3:
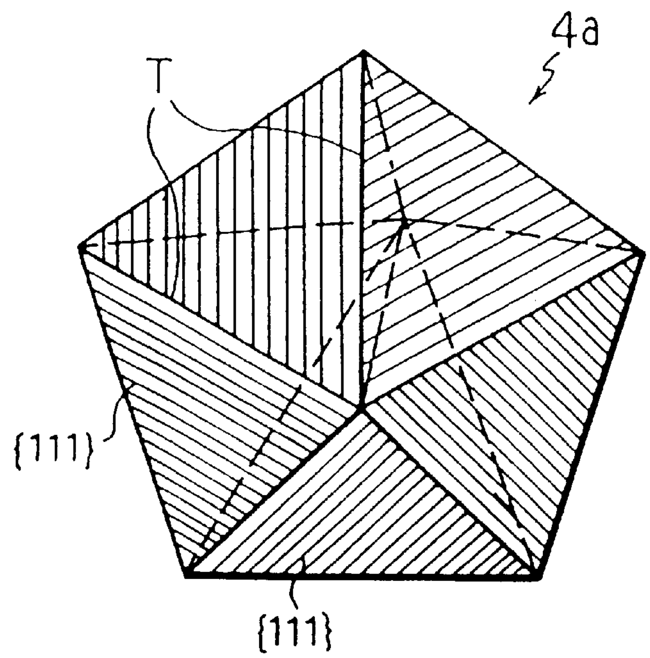
FIG. 3 is a model view illustrating the structure of the Al multiply twinned decahedral particle according to the present invention.

The diameter of the obtained ultrafine Al particles 4 depends on the intensity of the irradiated electron beam 3, but it mostly ranges from 2 to 50 nm. The diameter of the ultrafine Al particles 4 substantially corresponds to the distance from the metastable Al oxide particle 2. Ultrafine Al particles 4 with a larger diameter are generated closer to the metastable Al oxide particle 2. In the area with a certain distance from the metastable Al oxide particle 2, Al multiply twinned particles 4*a* having decahedron are obtained. As shown in FIG. 3, each of such Al multiply twinned particles 4*a* comprises five tetrahedron structure surrounded by {111} planes and combined with twin planes T interposed between them on the 2-D view.

The area where the Al multiply twinned decahedral particles 4*a* are obtained depends on the intensity of the irradiated electron beam 3. For example, when the electron beam having the intensity of about $3\times10^{20}$ e/cm$^2$·sec is irradiated, they are generated in the area with a distance of about 50 nm from the metastable Al oxide particle 2. The diameter of the ultrafine Al particles 4 generated in such area mostly ranges from 10 to 30 nm. The ultrafine Al particles 4 having such diameter become Al multiply twinned decahedral particles 4*a*. In other words, by controlling the diameter of the ultrafine Al particles 4 within the range from 10 to 30 nm, Al multiply twinned decahedral particles 4*a* surrounded by {111} planes can be obtained.

As described above, the Al clusters emitted from the metastable Al oxide particle 2 do not contain any oxygen and are in a quite active status. When such Al clusters become ultrafine Al particles 4 having a particular diameter, i.e., a diameter in the range from 10 to 30 nm as described above, Al multiply twinned decahedral particles 4*a* are formed.

When the ultrafine Al particles 4 have a particle diameter less than 10 nm, the energy status which can generate Al multiply twinned decahedral particles is not obtained. When the particle diameter exceeds 30 nm, decahedron particles cannot be maintained and, even if the particles have twin planes, they become oval or unshaped particles. Thus, the adequate energy status is obtained when the particle diameter of the ultrafine Al particles 4 is in the range from 10 to 30 nm, so that the Al multiply twinned decahedral particles 4*a* are formed.

A multiply twinned particles having a decahedron are obtained with other fcc metals such as Au and Pt. However, Al is susceptible to oxidation and Al particles could not been found by conventional methods. The conventionally reported ultrafine Al particles are merely square particles containing oxide.

The irradiation conditions of the electron beam 3 irradiated to the metastable Al oxide particle 2 is described in details below. When the intensity of the electron beam 3 irradiated to the metastable Al oxide particle 2 is less than $1.0\times10^{19}$ e/cm$^2$·sec, even if the ultrafine Al particles 4 can be generated from the metastable Al oxide particle 2, the Al clusters cannot be activated to the extent where Al multiply twinned decahedral particles 4*a* with a large distortion can be generated. In other words, the electron beam with an intensity of $1.0\times10^{19}$ e/cm$^2$.sec or more causes the localized heating effect for the metastable Al oxide particle 2 and the knock-on effect for the oxygen atoms and, sufficiently activates the Al clusters supplied from the metastable Al oxide particle 2. Thus, Al multiply twinned decahedral particles 4*a* as the object can be generated.

On the other hand, when the intensity of the electron beam 3 exceeds $1.0\times10^{21}$ e/cm$^2$·sec, the metastable Al oxide particle 2 is excessively damaged and it becomes difficult to control the Al clusters supplied from the metastable Al oxide particle 2. This also impedes generation of the Al multiply twinned decahedral particles 4*a* as the object. It is more preferable that the intensity of the irradiated electron beam 3 is in the range from $3\times10^{19}$ to $5\times10^{20}$ e/cm$^2$·sec.

The atmosphere when the electron beam 3 is irradiated to the metastable Al oxide particle 2 is preferably the vacuum atmosphere of $1\times10^{-5}$ Pa or less. In the atmosphere exceeding $1\times10^{-5}$ Pa, oxygen atoms cannot be removed sufficiently. In such case, the Al clusters supplied from the metastable Al oxide particle 2 may be oxidized and prevent generation of Al multiply twinned decahedral particles 4*a*.

Generation of an active Al cluster having no oxide largely affects forming of the Al multiply twinned decahedral particles 4*a*. It is not until the ultrafine Al particles 4 are generated with active Al atoms or Al clusters that the Al multiply twinned decahedral particles 4*a* is obtained. Supply of Al clusters of the like in an active status is affected by the amorphous carbon substrate 1 with the metastable Al oxide particle 2 placed on it. Only by irradiating the electron beam to the metastable Al oxide particle 2 placed on the amorphous carbon substrate 1 in the vacuum atmosphere and thereby generating the ultrafine Al particles 4 with active Al clusters or the like, it becomes possible to form the Al multiply twinned decahedral particles 4*a*.

The Al multiply twinned decahedral particle 4*a* has a large distortion on the twin planes. The crystals on both sides of each twin plane T are in the status of forced combination. With such distortion, the Al multiply twinned decahedral particle 4*a* is, when the magnetic field is applied, oriented so that the vertex direction of the decahedron becomes parallel with the applied magnetic field direction. Based on this magnetic field orientation property, the Al multiply twinned decahedral particles 4*a* can be easily controlled for orientation of the crystal direction. Therefore, it becomes possible to control the properties of ultrafine Al particles when they are applied to various devices and functional materials.

In addition, the twin planes T with a large distortion are chemically quite active. Therefore, the present invention can improve the activity for application of ultrafine Al particles to the catalyst, for example, and further can control their directions.

A specific embodiment of the present invention and its evaluation result are described below.

EMBODIMENT

Firstly, spherical θ-$Al_2O_3$ particles (purity: 99.8%) with a diameter of 90 to 200 nm were prepared as metastable Al oxide particles. The θ-$Al_2O_3$ particles were dispersed in alcohol and then applied to a carbon support film and dried. As the carbon support film, i-carbon (amorphous carbon) was used.

Secondly, the carbon support film with the spherical θ-$Al_2O_3$ particles was set on the room temperature stage disposed in the vacuum chamber of 200 kV TEM (JEM-2010 (Trade name) from JEOL). Then, after evacuating the air in the vacuum chamber to the vacuum degree of $1\times10^{-5}$ Pa, the electron beam of $2.1\times10^{20}$ e/cm$^2$·sec was irradiated to the θ-$Al_2O_3$ particles having a diameter of about 100 nm placed on the carbon support film for 50 seconds.

Figure 4:
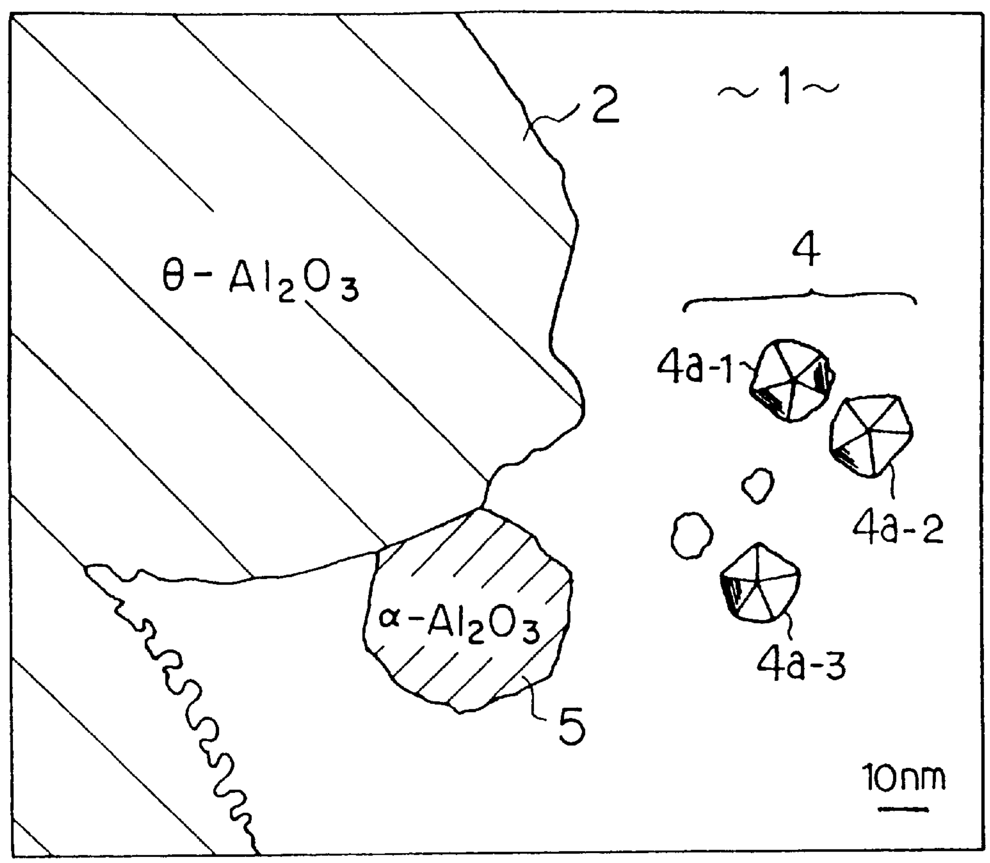
FIG. 4 is a model view illustrating the TEM observation result for the ultrafine Al particle production according to an embodiment of the present invention.

The status around the θ-$Al_2O_3$ particles after the electron beam irradiation was observed with TEM. As a result, many ultrafine Al particles with a diameter of about 1 to 50 nm were generated around the θ-$Al_2O_3$ particles. FIG. 4 shows the TEM observation result around the θ-$Al_2O_3$ particles as a model. As shown in FIG. 4, it is observed that Al multiply twinned particles 4*a* (4*a*-1 to 4*a*-3) having a decahedron structure were generated at positions relatively close to the θ-$Al_2O_3$ particles.

Figure 5:
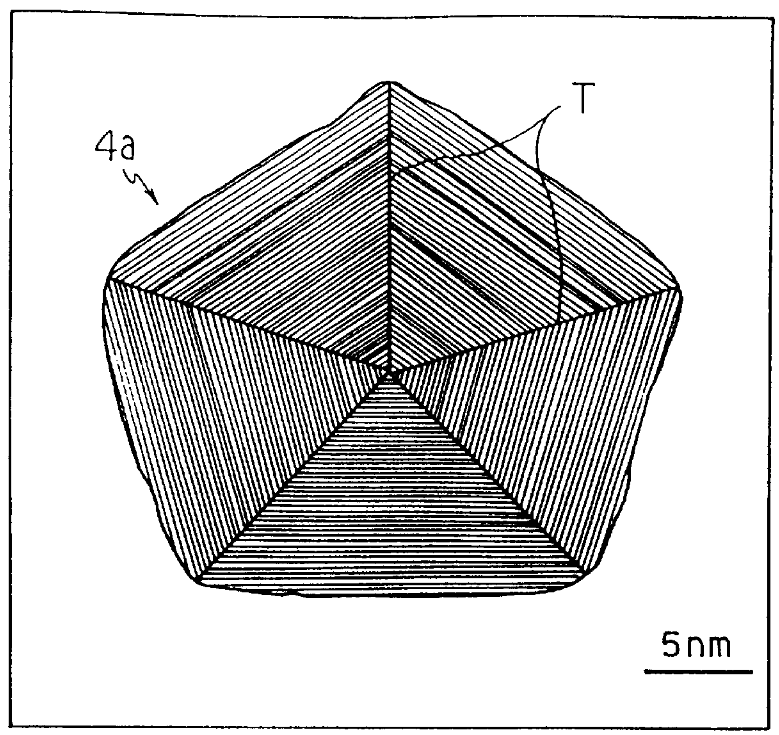
FIG. 5 is a model view illustrating the TEM observation result for the Al multiply twinned particle of FIG. 4.
Figure 6:
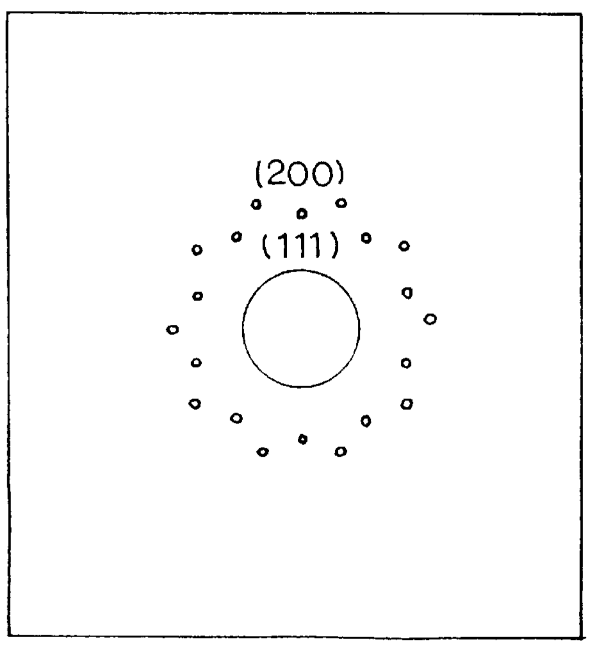
FIG. 6 is a model view illustrating an electron beam diffraction pattern for the Al multiply twinned particle of FIG. 4.

FIG. 5 shows a model of a TEM photograph image showing the Al multiply twinned particle 4*a*-1. FIG. 6 shows the electron beam diffraction pattern for the Al multiply twinned particle 4*a*-1. From these figures, it was learned that the Al multiply twinned particle 4*a*-1 had a decahedron structure surrounded by {111} planes as shown in FIG. 3. In short, the Al multiply twinned particle 4*a*-1 was a multiply twinned decahedral particle surrounded by {111} planes. This observation also applied to other Al multiply twinned particles 4*a*-2 and 4*a*-3.

The diameters and structures of many ultrafine Al particles formed by electron beam irradiation to the θ-$Al_2O_3$ particles were compared and studied. As a result, it was found that ultrafine Al particles with a diameter less than 10 nm were substantially spherical. With a diameter exceeding 30 nm, the particles were oval or unshaped. In contrast, when the diameter was in the range from 10 to 30 nm, the ultrafine Al particles became the Al multiply twinned particles 4*a* having pentagonal decahedron. Some particles with a diameter exceeding 30 nm happened to be multiply twinned particles, but they were spherical or unshaped and were not decahedron structures. Further, the positions where the Al multiply twinned decahedral particles 4*a* have been formed were checked and it was found that they were generated in the range of 50 nm from the θ-$Al_2O_3$ particles for the electron beam intensity of this embodiment.

Thus, it is learned that the Al multiply twinned decahedral particles 4*a* are generated corresponding to the diameter of the ultrafine Al particles. The diameters of the ultrafine Al particles are substantially determined by the electron beam irradiation intensity for the θ-$Al_2O_3$ particles and the corresponding generation positions. It was observed that the Al multiply twinned decahedral particles **4*a*** were obtained with a good reproducibility by irradiating the electron beam with an intensity ranging from $1.0\times10^{19}$ to $1.0\times10^{21}$ e/cm$^2$·sec. to the θ-$Al_2O_3$ particles and thereby generating the ultrafine Al particles with a diameter of 10 to 30 nm.

According to the TEM observation results, the Al multiply twinned particles **4*a* having decahedron had their vertex of the decahedron oriented perpendicular to the observation plane. This is supposed to be caused by the magnetic field applied perpendicular to the observation plane in TEM observation. Thus, the Al multiply twinned decahedral particles 4*a* are oriented so that the vertex direction of the decahedron becomes parallel with the direction of the applied magnetic field. This means that the crystal directions and crystal planes of the Al multiply twinned particles 4*a* can be easily controlled for orientation. When applying the ultrafine Al particles to functional materials such as catalyst and to various devices, it is possible to control the properties of the Al multiply twinned particles 4*a***.

As understood from the above embodiment, the present invention enables generation of ultrafine Al particles as an unit substance, for which crystal directions are easily controlled so that various operations and controls become available. Therefore, this invention largely contributes to the physical property study and application development of the ultrafine Al particles.

What is claimed is:

1. An ultrafine Al particle structure comprising:

an amorphous carbon substrate; and an ultrafine Al particle disposed on the amorphous carbon substrate, the ultrafine Al particle consisting of an Al multiply twinned particle having a decahedron structure surrounded by {111} planes and having a diameter of 10 to 30 nm.

2. The ultrafine Al particle structure as set forth in claim 1:

wherein the Al multiple twinned particle comprises five grains having a tetrahedron structure surrounded by {111} planes and combined with twin planes interposed between them.

3. The ultrafine Al particle structure as set forth in claim 2:

wherein the Al multiply twinned particle has a distortion on the twin planes.

4. The ultrafine Al particle structure as set forth in claim 2:

wherein the twin planes have chemical activity.

5. An ultrafine Al particle structure comprising:

an amorphous carbon substrate; and a plurality of ultrafine Al particles disposed on the amorphous carbon substrate, the ultrafine Al particles consisting of Al multiply twinned particles having a decahedron structure surrounded by {111} planes and having a diameter of 10 to 30 nm.

6. The ultrafine Al particle structure as set forth in claim 5:

wherein the Al multiply twinned particles have their vertex of the decahedron structures oriented perpendicular to a surface of the amorphous carbon substrate.

* * * * *

UNITED STATES PATENT AND TRADEMARK OFFICE

CERTIFICATE OF CORRECTION

PATENT NO.: 6,033,783

DATED: March 7, 2000

INVENTOR(S): Tanaka et al.

It is certified that an error appears in the above-identified patent and that said Letters Patent is hereby corrected as shown below:

Title page, item [54], line 1 of the title, change "AL" to --Al--.

Signed and Sealed this

Third Day of April, 2001

Attest:

NICHOLAS P. GODICI

*Attesting Officer* *Acting Director of the United States Patent and Trademark Office*